United States Patent
Choi et al.

(10) Patent No.: US 9,755,093 B2
(45) Date of Patent: Sep. 5, 2017

(54) PHOTOELECTRONIC DEVICE USING HYBRID STRUCTURE OF SILICA NANO PARTICLES—GRAPHENE QUANTUM DOTS AND METHOD OF MANUFACTURING THE SAME

(71) Applicant: UNIVERSITY-INDUSTRY COOPERATION GROUP OF KYUNG HEE UNIVERSITY, Yongin-si, Gyeonggi-do (KR)

(72) Inventors: Suk Ho Choi, Suwon-si (KR); Sung Kim, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/208,768

(22) Filed: Jul. 13, 2016

(65) Prior Publication Data

US 2017/0110609 A1    Apr. 20, 2017

(30) Foreign Application Priority Data

Oct. 19, 2015    (KR) ........................ 10-2015-0145614

(51) Int. Cl.
| | | |
|---|---|---|
| H01L 33/26 | (2010.01) | |
| H01L 31/0256 | (2006.01) | |
| H01L 31/0352 | (2006.01) | |
| H01L 31/028 | (2006.01) | |
| H01L 31/18 | (2006.01) | |
| H01L 33/00 | (2010.01) | |

(Continued)

(52) U.S. Cl.
CPC .. *H01L 31/035218* (2013.01); *H01L 29/1606* (2013.01); *H01L 31/028* (2013.01); *H01L 31/1804* (2013.01); *H01L 33/0054* (2013.01); *H01L 33/06* (2013.01); *H01L 33/26* (2013.01)

(58) Field of Classification Search
CPC ..... H01L 31/035209; H01L 31/035218; H01L 33/26
See application file for complete search history.

(56) References Cited

U.S. PATENT DOCUMENTS

| | | | | |
|---|---|---|---|---|
| 8,154,007 | B2 * | 4/2012 | Shieh | B82Y 20/00 257/12 |
| 9,377,662 | B2 * | 6/2016 | Lee | G02F 1/1521 |
| 9,443,998 | B2 * | 9/2016 | Werner | C23C 16/30 |

FOREIGN PATENT DOCUMENTS

| | | |
|---|---|---|
| CN | 102709399 B | 10/2012 |
| KR | 10-0971197 B1 | 7/2010 |

(Continued)

OTHER PUBLICATIONS

Choi et al., Machine's English Translation of KR 101 558 801, Oct. 2015, 20 pages.*

(Continued)

*Primary Examiner* — Evan Pert
(74) *Attorney, Agent, or Firm* — Sughrue Mion, PLLC

(57) ABSTRACT

Disclosed are a photoelectronic device using a hybrid structure of silica nanoparticles and graphene quantum dots and a method of manufacturing the same. The photoelectronic device according to the present disclosure has a hybrid structure including graphene quantum dots (GQDs) bonded to surfaces of silica nanoparticles (SNPs), thereby increasing energy transfer efficiency.

7 Claims, 13 Drawing Sheets

(51) Int. Cl.
   *H01L 33/06*      (2010.01)
   *H01L 29/16*      (2006.01)

(56) References Cited

FOREIGN PATENT DOCUMENTS

| KR | 10-2012-0049273 A | 5/2012 | | |
|---|---|---|---|---|
| KR | 10-2013-0038428 A | 4/2013 | | |
| KR | 10-1421064 B1 | 7/2014 | | |
| KR | 10-2014-0134131 A | 11/2014 | | |
| KR | 10-2015-0014557 A | 2/2015 | | |
| KR | 10-1520804 B1 | 5/2015 | | |
| KR | 10-1558801 B1 | 10/2015 | | |
| WO | WO2016/125189 | * | 8/2016 | ............. C01B 31/04 |

OTHER PUBLICATIONS

Yao et al., "Mesoporous Silica Nanopartiles Capped with Graphene Quantum Dots for Potential Chemo-Photothermal Synergistic Therapy", American Chemical Society, Dec. 2016, pp. 591-599.*
Lee et al., English Machine Translation of WO/2011/0080604, Jan. 2011.*
Communication from the European Patent Office dated Feb. 23, 2017 in corresponding European Patent Application No. 16178407.9.
Office Action issued in KR 10-2015-0145614 dated May 27, 2016.

* cited by examiner

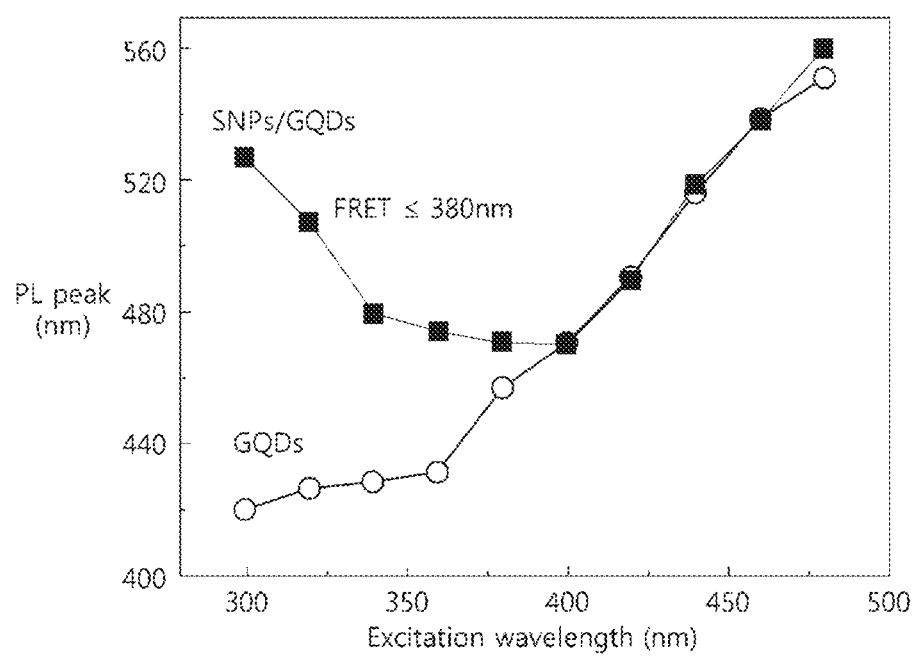

PHOTOELECTRONIC DEVICE USING HYBRID STRUCTURE OF SILICA NANO PARTICLES—GRAPHENE QUANTUM DOTS AND METHOD OF MANUFACTURING THE SAME

CROSS-REFERENCE TO RELATED APPLICATION

This application claims the priority benefit of Korean Patent Application No. 10-2015-0145614, filed on Oct. 19, 2015 in the Korean Intellectual Property Office, the disclosure of which is incorporated herein by reference.

BACKGROUND OF THE INVENTION

Field of the Invention

The present disclosure relates to a photoelectronic device using a hybrid structure of silica nanoparticles and graphene quantum dots for increasing energy transfer efficiency by binding graphene quantum dots to silica nanoparticles and a method of manufacturing the same.

Description of the Related Art

Photoelectronic devices convert optical energy into electric energy or electric energy into optical energy. To increase such energy conversion efficiency, technology for using quantum dots in photoelectronic devices is being developed.

Quantum dots, which are semiconductor nanoparticles with a diameter of several nanometers (nm), exhibit quantum mechanical characteristics such as quantum confinement. Such quantum dots autonomously release energy corresponding to their energy band gap upon entering an exited state by light from an excitation source. Since the energy band gap can be controlled by adjusting the sizes of the quantum dots, their electrical/optical characteristics can be also controlled. Accordingly, quantum dots can be applied to light-emitting devices, photoelectric conversion devices, or the like.

Meanwhile, quantum dots can be densely arranged closely to each other such that energy transfer among quantum dots is facilitated. The electrical/optical characteristics of photoelectronic devices are improved with increasing energy transfer efficiency among quantum dots, and thus, research into increasing energy transfer efficiency is underway. However, even when quantum dots are densely arranged, the contact areas for transferring energy are small, thereby limiting increase in energy transfer efficiency. Therefore, there is a need for a method of increasing energy transfer efficiency among quantum dots.

RELATED DOCUMENTS

Patent Document

Korean Patent No. 10-0971197 (Jul. 13, 2010), entitled "QUANTUM DOT HAVING IMPROVED ELECTRON TRANSPORTING PERFORMANCE AND METHOD FOR MANUFACTURING THEREOF"

Korean Patent Laid-Open Publication No. 2014-0134131 (Nov. 21, 2014), entitled "GRAPHENE QUANTUM DOT PHOTODETECTOR AND THE FABRICATING METHOD THEREOF"

Korean Patent No. 10-1520804 (May 11, 2015), entitled "HIGH-EFFICIENT SOLAR CELL USING WIDE-BAND ABSORPTION AND ENERGY TRANSFER"

SUMMARY OF THE INVENTION

Therefore, the present invention has been made in view of the above problems, and it is an object of the present invention to provide a photoelectronic device with a hybrid structure of silica nanoparticles and graphene quantum dots for increasing energy transfer efficiency by binding graphene quantum dots to silica nanoparticles and a method of manufacturing the same.

In accordance with the present invention, the above and other objects can be accomplished by the provision of a photoelectronic device including a hybrid structure of silica nanoparticles-graphene quantum dots, wherein the photoelectronic device includes an energy conversion layer having a hybrid structure that includes graphene quantum dots (GQDs) bonded to surfaces of silica nanoparticles (SNPs) and electrodes formed on upper and lower parts of the energy conversion layer.

The silica nanoparticles may have spherical shapes, and the graphene quantum dots may have two-dimensional planar shapes and be bonded to surfaces of the spherical silica nanoparticles.

The silica nanoparticles may be surface-treated for bonding to the graphene quantum dots.

A method of manufacturing the photoelectronic device including the hybrid structure of the silica nanoparticles-graphene quantum dots includes: forming a first electrode on a substrate; forming an energy conversion layer having a hybrid structure of silica nanoparticles (SNPs) and graphene quantum dots (GQDs) bonded to surfaces of the silica nanoparticles (SNPs) on the first electrode; and forming a second electrode on the energy conversion layer.

The forming of the energy conversion layer may include: manufacturing the silica nanoparticles; manufacturing the graphene quantum dots; surface-treating the silica nanoparticles; and binding the graphene quantum dots to the surface-treated silica nanoparticles.

The surface treating of the silica nanoparticles may include: adsorbing $NH_2$ ligands to the silica nanoparticles to positively charge the surfaces of the silica nanoparticles; mixing the silica nanoparticles, to which the $NH_2$ ligands are adsorbed, with an HCl solution; and drying the silica nanoparticles by filtering the HCl solution.

The binding of the graphene quantum dots to the silica nanoparticles may include mixing the graphene quantum dots immersed in deionized water and the surface-treated silica nanoparticles and mixing an ammonium solution with the deionized water, followed by binding the graphene quantum dots to the surfaces of the silica nanoparticles by means of an ultrasonicator.

BRIEF DESCRIPTION OF THE DRAWINGS

The above and other objects, features and other advantages of the present invention will be more clearly understood from the following detailed description taken in conjunction with the accompanying drawings, in which.

Figure 12:
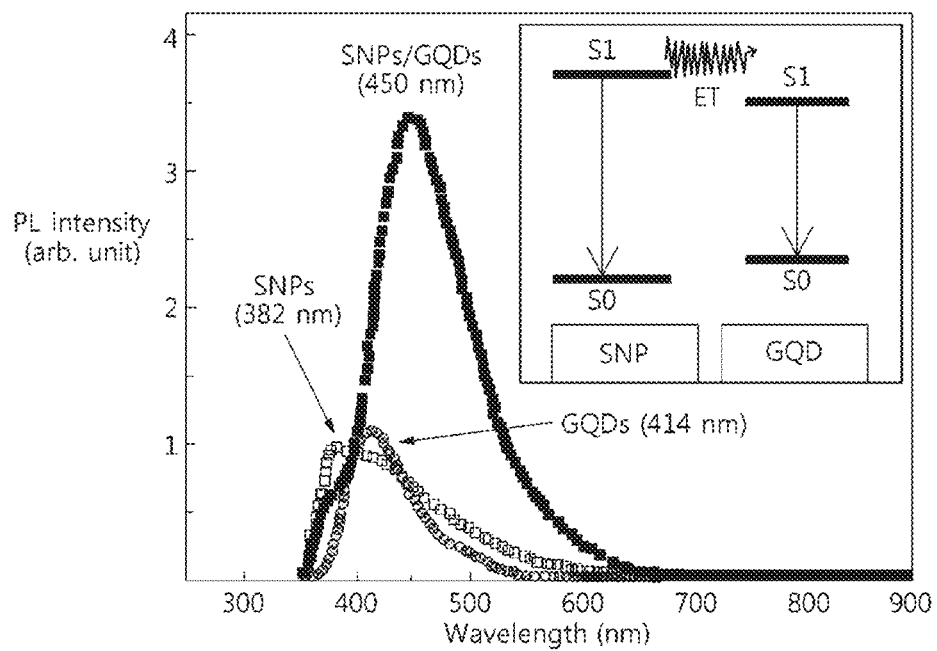
Figure 14A:
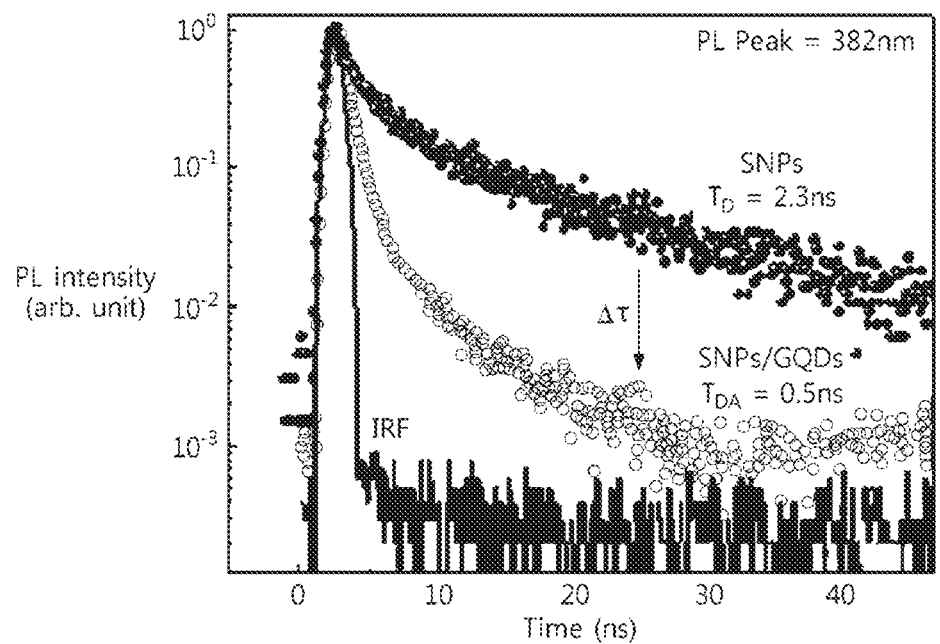
Figure 14B:
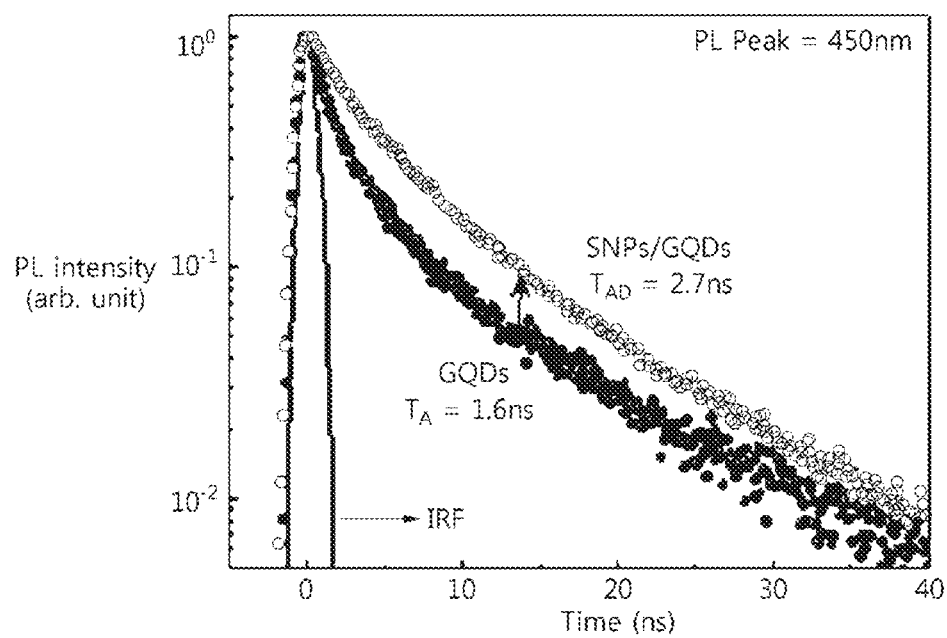
Figure 15:
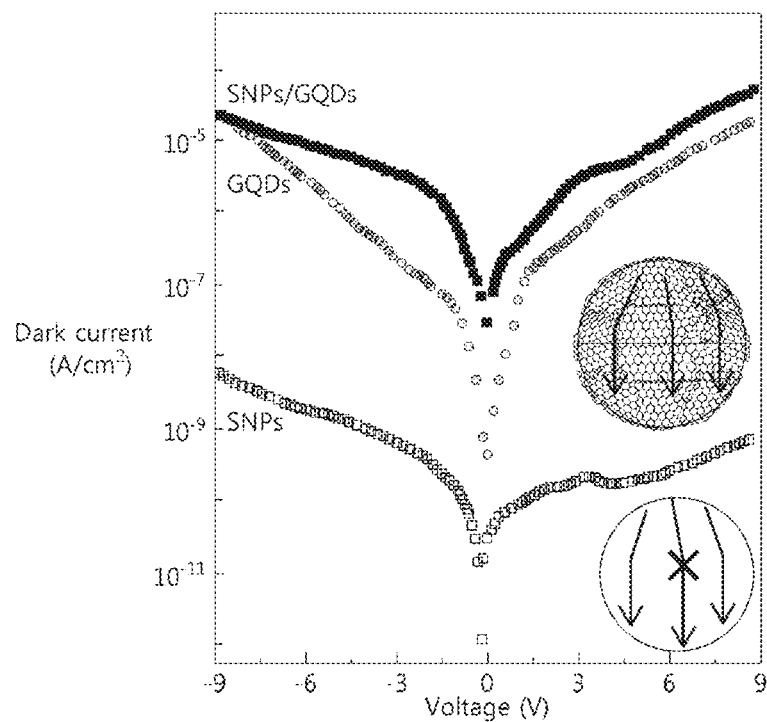
Figure 16A:
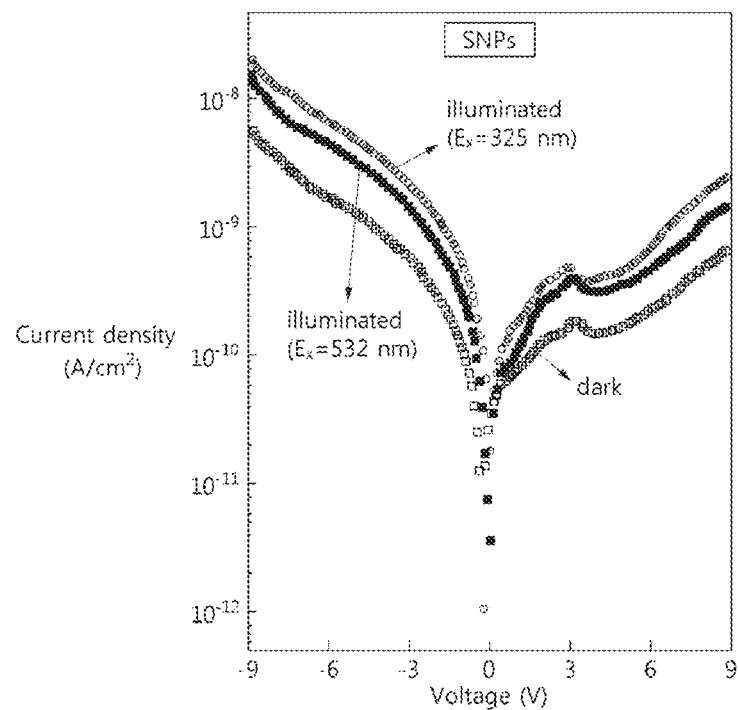
Figure 16B:
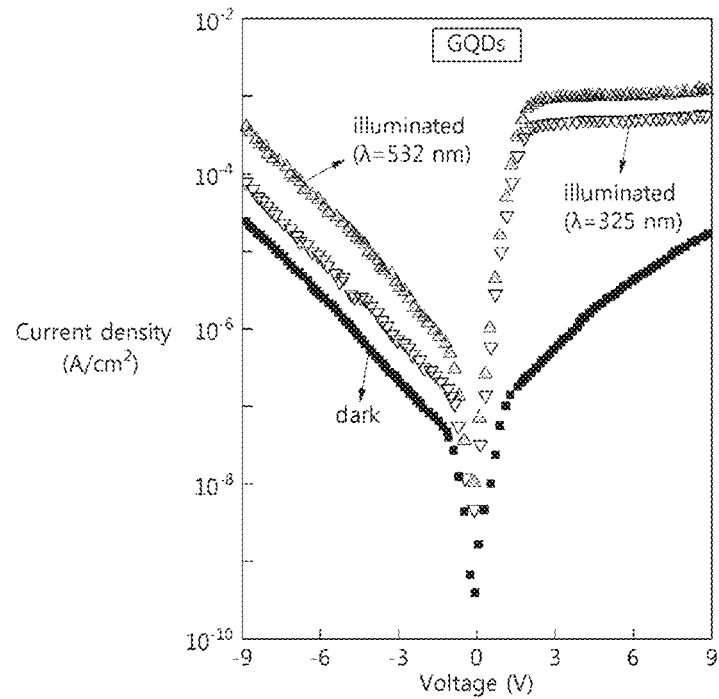
Figure 16C:
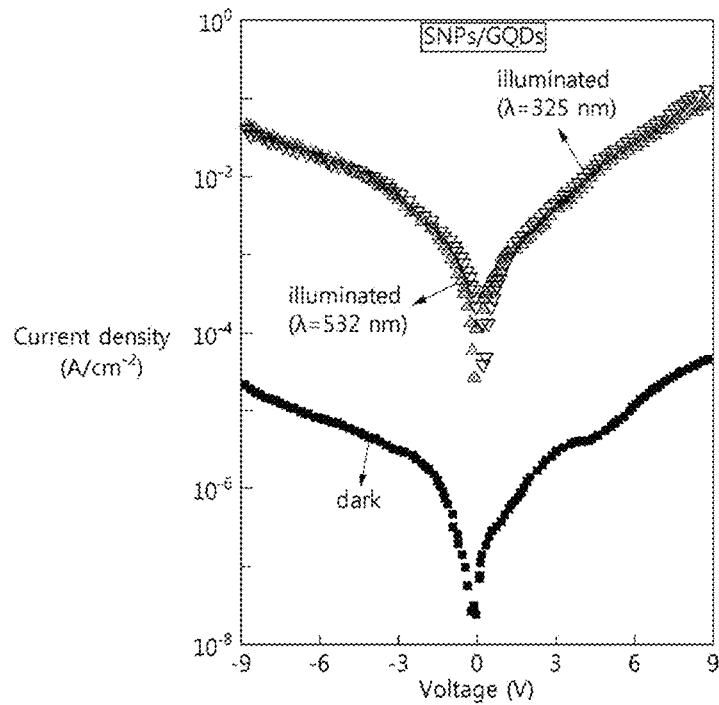
Figure 17A:
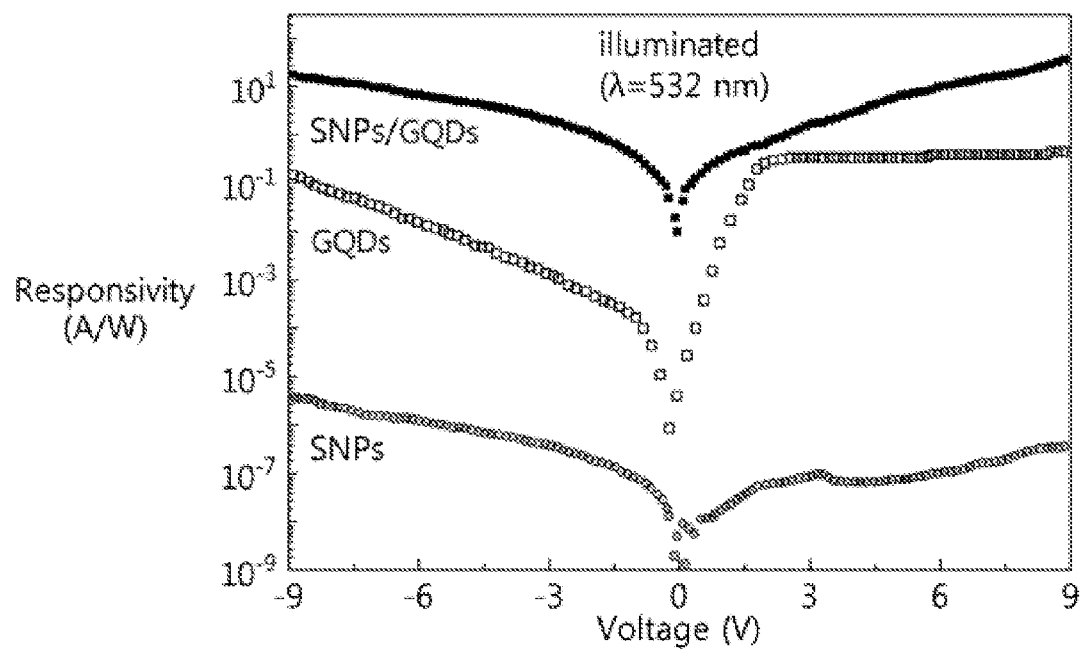
Figure 17B:
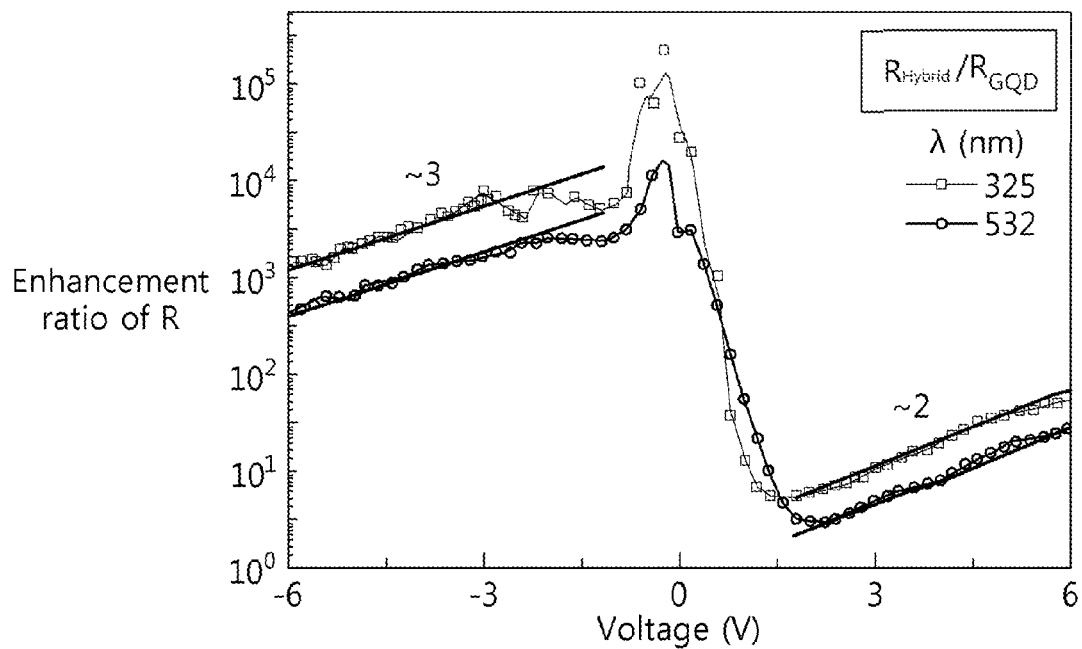

FIGS. 12 and 13 are photoluminescence (PL) and photoluminescence peak shift graphs of photoelectronic devices according to Comparative Examples 1 and 2 and a photoelectronic device including a hybrid structure of silica nanoparticles (SNPs)/graphene quantum dots (GQDs) according to an example of the present disclosure;

FIGS. 14A and 14B are photoluminescence (PL) lifespan graphs of photoelectronic devices according to Comparative Examples 1 and 2 and a photoelectronic device including a hybrid structure of silica nanoparticles (SNPs)/graphene quantum dots (GQDs) according to an example of the present disclosure;

FIG. 15 illustrates voltage-dark current curves of photoelectronic devices according to Comparative Examples 1 and 2 and a photoelectronic device including a hybrid structure of silica nanoparticles (SNPs)/graphene quantum dots (GQDs) according to an example of the present disclosure;

FIGS. 16A to 16C illustrate voltage-current curves dependent upon incident light of photoelectronic devices according to Comparative Examples 1 and 2 and a photoelectronic device including a hybrid structure of silica nanoparticles (SNPs)/graphene quantum dots (GQDs) according to an example of the present disclosure; and FIGS. 17A and 17B illustrate graphs of light responsivity dependent upon voltage of photoelectronic devices according to Comparative Examples 1 and 2 and a photoelectronic device including a hybrid structure of silica nanoparticles (SNPs)/graphene quantum dots (GQDs) according to an example of the present disclosure.

DETAILED DESCRIPTION OF THE INVENTION

The present invention will now be described more fully with reference to the accompanying drawings and contents disclosed in the drawings. This invention may, however, be embodied in many different forms and should not be construed as limited to the exemplary embodiments set forth herein.

When an element or a layer is referred to as being "on" another element or layer, the element or layer can be directly on another element or layer or an intervening element or layer can be present. On the other hand, when an element or layer is referred to as being "directly on" another element or layer, an intervening element or layer is not present.

Spatially relative terms such as "below", "beneath", "lower", "above", or "upper" may be used herein to describe one element's relationship to another element as illustrated in the Figures. It will be understood that spatially relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are employed to suitably express embodiments of the present invention, and can be changed according to the intention of clients or operators, practices in the art, or the like. Accordingly, definitions of the terms should be understood on the basis of the entire description of the present specification.

Figure 1:
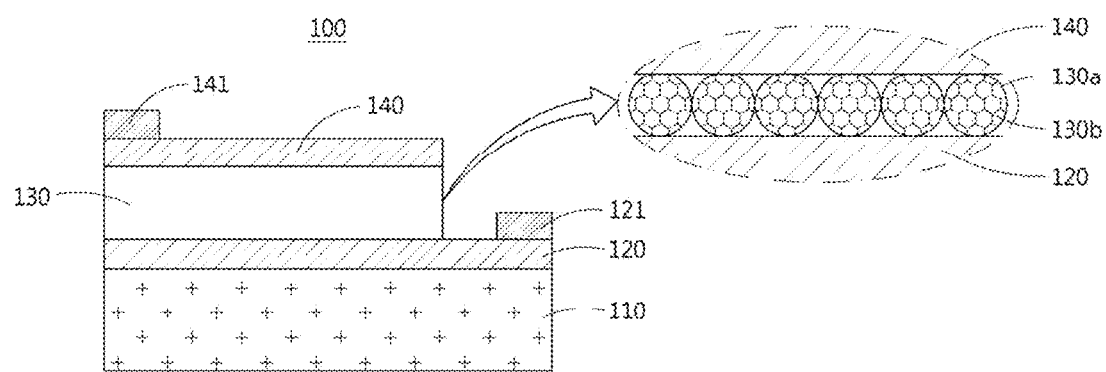
FIG. 1 illustrates a photoelectronic device according to an example of the present disclosure.

FIG. 1 illustrates a photoelectronic device according to an example of the present disclosure.

Referring to FIG. 1, a photoelectronic device 100 according to an example of the present disclosure includes a hybrid structure of silica nanoparticles (SNPs)-graphene quantum dots (GQDs). In particular, the photoelectronic device 100 includes the substrate 110, a first electrode 120, an energy conversion layer 130, and a second electrode 140.

The energy conversion layer 130 may have a hybrid structure wherein graphene quantum dots (GQDs) 130b are bonded to surfaces of silica nanoparticles (SNPs) 130a.

Amorphous silica, $SiO_2$, is very hard, thermally and chemically stable, and nontoxic, thus having attracted attention as a next-generation material for use in electronics. However, since silica has photophysical characteristics and is transparent, inactive, and hydrophilic, silica does not transfer energy or electrons. However, when silica is processed to micro or nano scale, silica can transfer energy or electrons and, without doping with a phosphor, has improved optical absorption in infrared, ultraviolet, and visible light bands and light-emitting characteristics.

In addition, graphene quantum dots (GQDs) have superior optical absorption characteristics in ultraviolet and visible light bands and luminescence when exposed to ultraviolet and near-infrared light. Accordingly, graphene quantum dots (GQDs) can be used as energy donors or energy acceptors. In addition, graphene quantum dots (GQDs) have long light-emitting lifespan, high photostability, and a high quantum yield, and thus, can be applied to an energy transfer system.

According to an example, in the energy conversion layer 130, the silica nanoparticles (SNPs) function as energy donors and the graphene quantum dots (GQDs) function as energy acceptors and thus energy transfer occurs therebetween. That is, the energy conversion layer 130 functions as an energy transfer system.

To increase energy transfer efficiency of the energy conversion layer 130, an area to which energy is transferred, i.e., binding areas between silica nanoparticles (SNPs) and graphene quantum dots (GQDs), is preferably wide.

According to the example, the silica nanoparticles (SNPs) are spherical shapes and the graphene quantum dots (GQDs) have two-dimensional planar shapes. Several graphene quantum dot fragments may bind to a silica nanoparticle by enveloping the entire surface of the silica nanoparticle.

In addition, to improve binding force between the silica nanoparticles (SNPs) and the graphene quantum dots (GQDs), the silica nanoparticles (SNPs) may be surface-treated. A particular surface treatment method is described below.

Figure 2:
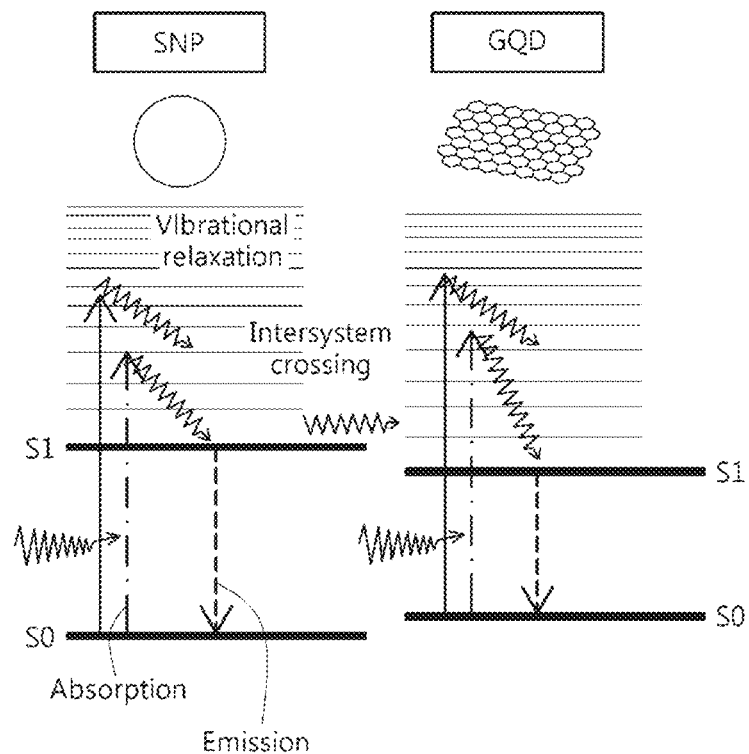
FIGS. 2 and 3 illustrate an energy transfer mechanism according to an example of the present disclosure.
Figure 3:
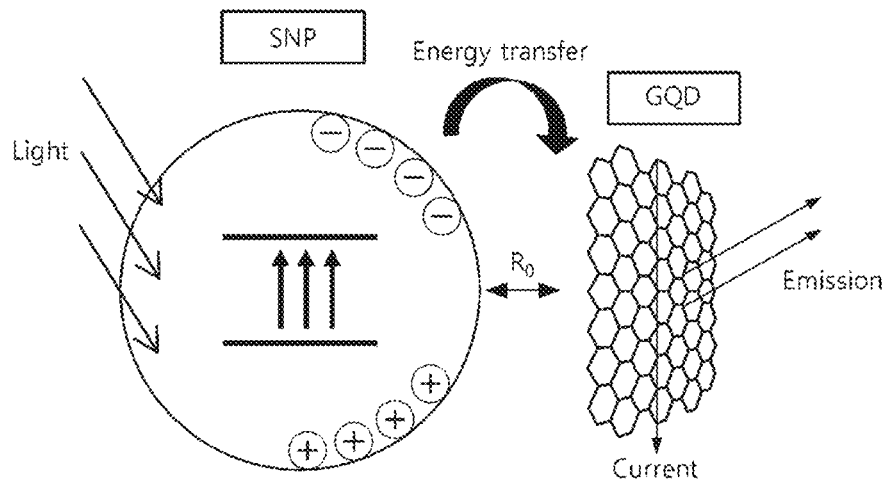

FIGS. 2 and 3 illustrate an energy transfer mechanism according to an example of the present disclosure. Referring to FIGS. 2 and 3, when light is radiated to the hybrid structure wherein the graphene quantum dots (GQDs) are bonded to the surfaces of the silica nanoparticles (SNPs), interaction between the silica nanoparticles (SNPs) and the graphene quantum dots (GQDs) occurs.

In particular, when light is radiated, the light is absorbed by the silica nanoparticles (SNPs) and thus electron-hole pairs (+, −) are generated on the surfaces of the silica nanoparticles. Here, some electron-hole pairs are emitted as heat and lost. The remaining electron-hole pairs emit light via a recombination process. In this process, energy transfer between the silica nanoparticles (SNPs) and the graphene quantum dots (GQDs) bonded to SNPs occurs.

Since the minimum energy levels (S1) of the silica nanoparticles (SNPs) are higher than those of the graphene quantum dots (GQDs), energy transfer occurs from the silica nanoparticles (SNPs) to the graphene quantum dots (GQDs). That is, the silica nanoparticles (SNPs) function as energy donors and the graphene quantum dots (GQDs) function as energy acceptors.

When light is radiated, most electron-hole pairs are formed on surfaces of the silica nanoparticles (SNPs), and thus, distances ($R_0$) between the silica nanoparticles (SNPs) and the graphene quantum dots (GQDs) are shortened, whereby energy transfer is facilitated. In the example of the present invention, the graphene quantum dots (GQDs) are bonded to the silica nanoparticles (SNPs) in a form of enveloping the entire surfaces of the silica nanoparticles (SNPs), thereby increasing energy transfer efficiency of the hybrid structure. When energy transfer efficiency increases, light emission and current flow in graphene quantum dots (GQDs) can increase.

FIGS. 4 to 9 illustrate a method of manufacturing a photoelectronic device according to an example of the present disclosure.

Figure 4:
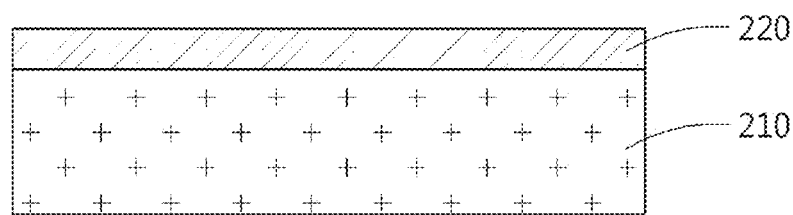
FIGS. 4 to 9 illustrate a method of manufacturing a photoelectronic device according to an example of the present disclosure.

To manufacture a photoelectronic device, graphene is first transferred on a substrate 210 to form a first electrode 220, as illustrated in FIG. 4. The substrate 210 may be a SiO2 or Si substrate. In addition, the substrate 210 may be a hard substrate, such as a gallium arsenide, silicon germanium, ceramic, or quartz substrate or a glass substrate for display, or a fusible plastic substrate, such as polyimide, polyethylene terephthalate (PET), polyethylene naphthalate (PEN), poly(methyl methacrylate) (PMMA), polycarbonate (PC), polyethersulfone (PES), or polyester). However, the substrate 210 is not limited to the substrate types and may be other substrates having optical transparency allowing penetration of light.

<Manufacture of Hybrid Structure of Silica Nanoparticles-Graphene Quantum Dots>

Figure 5:
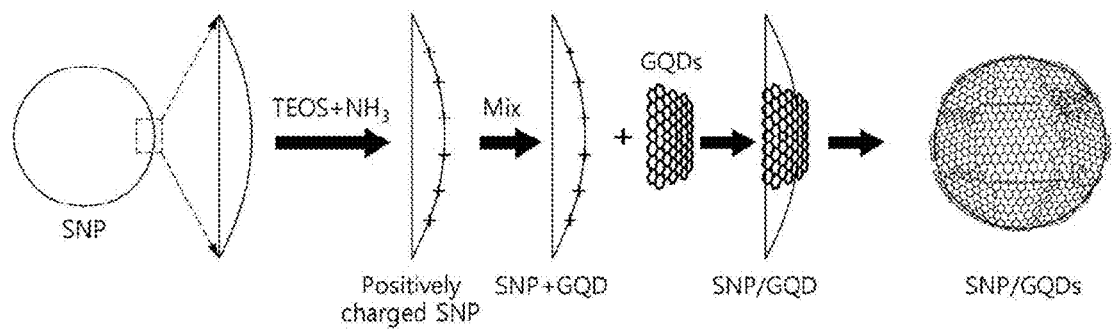
Figure 6A:
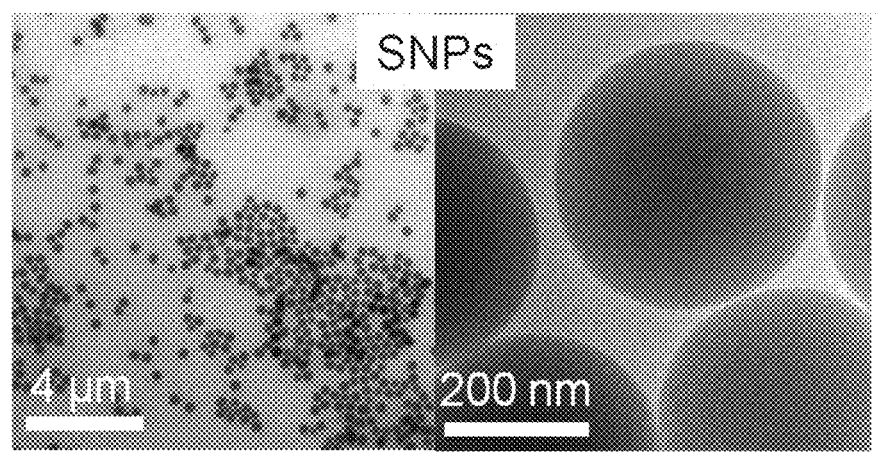
Figure 6B:
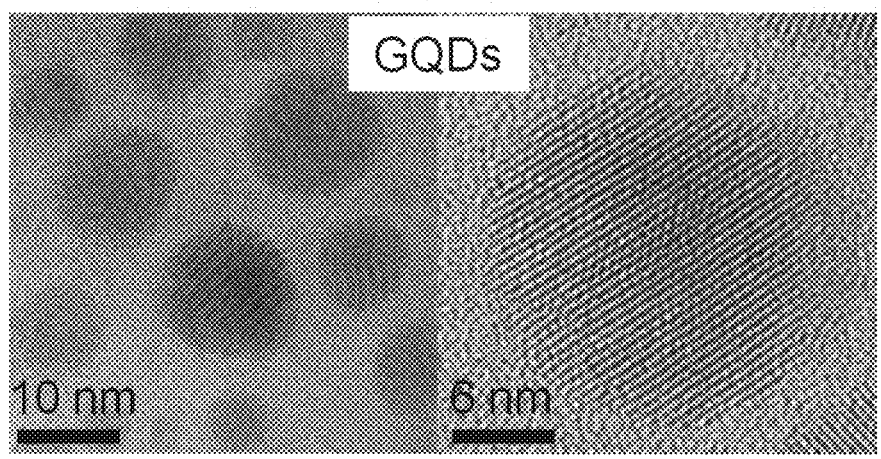
Figure 7A:
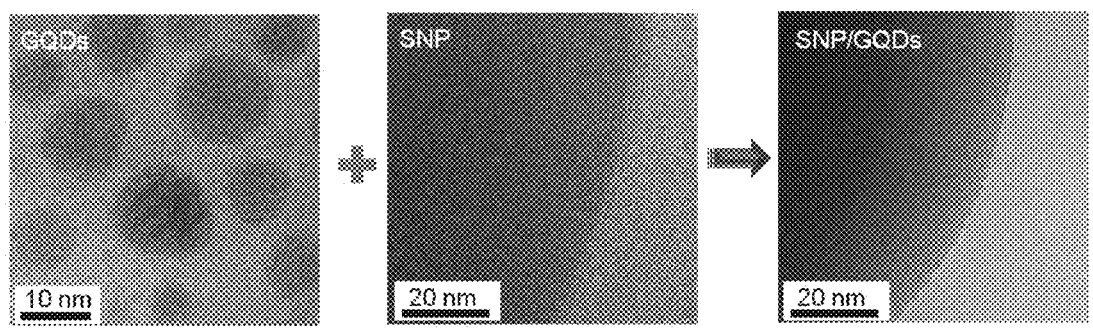
Figure 7B:
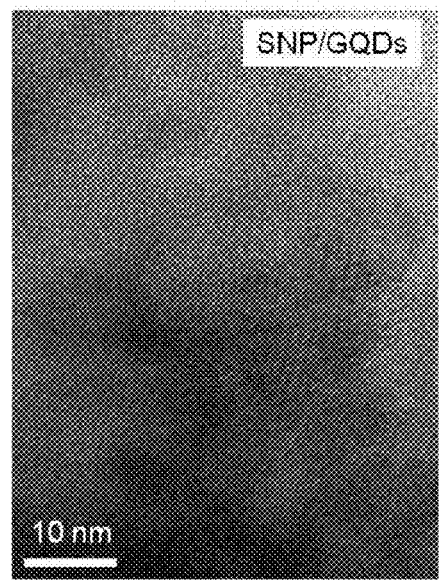

FIG. 5 illustrates a method of manufacturing the hybrid structure of the silica nanoparticles-graphene quantum dots according to an example of the present disclosure. FIGS. 6A and 6B show transmission electron microscope (TEM) images of the silica nanoparticles (SNPs) and the graphene quantum dots (GQDs) manufactured according to an example of the present disclosure. In addition, FIG. 7A shows TEM images of the silica nanoparticles, the graphene quantum dots, and the hybrid structure of the silica nanoparticles-graphene quantum dots. FIG. 7B shows a high-resolution (HR) TEM image of a surface of the hybrid structure of the silica nanoparticles-graphene quantum dots.

Referring to FIG. 5, the silica nanoparticles (SNPs) are first manufactured. The silica nanoparticles (SNPs) may be manufactured using the Stöber process. In particular, the silica nanoparticles are formed through a process in which a silica precursor, tetraethyl orthosilicate (TEOS), is hydrolyzed with an aqueous alkaline solvent including an alkaline catalyst. Here, ammonia water ($NH_3$), sodium hydroxide (NaOH), or the like may be used as a catalyst.

By using the Stöber process, the silica nanoparticles (SNPs) can be massively produced and can be manufactured to various diameters of 15 nm to 800 nm.

As illustrated in FIG. 6A, it can be confirmed that silica nanoparticles (SNPs) manufactured through the process have a uniform size and a spherical shape.

The graphene quantum dots are manufactured from a graphene oxide according to a hydrothermal method. A solution including the graphene quantum dots having various sizes was subjected to filtering and dialysis (dialysis) processes to classify the graphene quantum dots by size. Graphene quantum dots having an average size of 12 nm were selected. Quantum dots (GDQs) produced by this process are illustrated in FIG. 6B.

Meanwhile, the silica nanoparticles (SNPs) may be surface-treated before being combined with the graphene quantum dots (GQDs). This surface treatment may be performed as a pre-treatment for facilitating binding of the graphene quantum dots (GQDs) to surfaces of the silica nanoparticles (SNPs).

The surface treatment was carried out as follows: $NH_2$ ligands were adsorbed to surfaces of the silica nanoparticles (SNPs) to positively charge the surfaces of the silica nanoparticles (SNPs), and then the silica nanoparticles (SNPs) were mixed with a 3 M HCl solution, followed by standing for nine hours.

Subsequently, filtering was carried out with HCl and the silica nanoparticles were incubated and dried in a 100° C. oven for three hours. The silica nanoparticles surface-treated with HCl were mixed with graphene quantum dots (GQDs) immersed in deionized water. An ammonium solution was added and mixed with the deionized water to adjust pH to 10, followed by allowing reaction therebetween in an ultrasonicator.

By this process, negatively charged graphene quantum dots (GQDs) are strongly bonded to the $NH_2$ ligands adsorbed to surfaces of the silica nanoparticles (SNPs).

The graphene quantum dots (GQDs) have a two-dimensional planar shape and a plurality of the graphene quantum dots (GQDs) are immersed in deionized water. Accordingly, several graphene quantum dot fragments are bonded to and envelop a surface of a silica nanoparticle (SNP), as illustrated in FIG. 5. In this case, the number of the graphene quantum dot fragments bonded to the surface of silica nanoparticle (SNP) may depend upon the surface area of the silica nanoparticle (SNP).

Referring to FIG. 7A, it can be observed that the graphene quantum dots (GQDs) are bonded to a surface of the silica nanoparticle (SNP), whereby a clean and smooth silica nanoparticle (SNP) surface before binding becomes tough after binding. In addition, as illustrated in the HR-TEM image of FIG. 7B, a crystalline pattern is observed. Accordingly, it can be confirmed that the graphene quantum dots (GQDs) are bonded to surfaces of the silica nanoparticles (SNPs).

<Manufacture of Photoelectronic Device Having Hybrid Structure of Graphene-Silica Quantum Dots>

Figure 8:
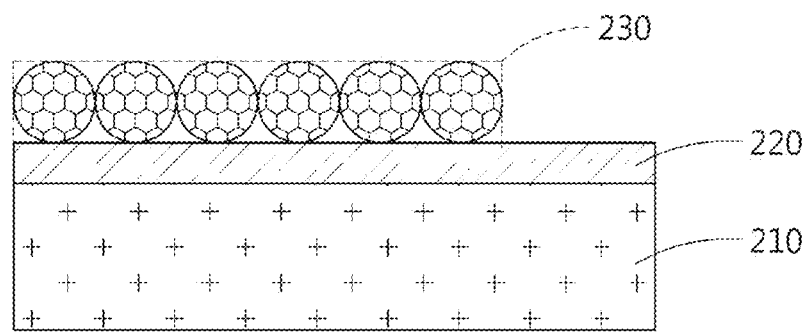

As illustrated in FIG. 8, an energy conversion layer 230 having the hybrid structure of silica nanoparticles (SNPs)-graphene quantum dots (GQDs) manufactured by the process shown in FIG. 5 is transferred onto a first electrode 220 shown in FIG. 4. Subsequently, a second electrode 240 is formed on the energy conversion layer 230 to manufacture a photoelectronic device. The second electrode 240 may be formed by the grapheme transfer method as in the first electrode 220.

Although not shown in the drawings, a contact electrode (not shown) may be disposed on each of the first and second electrodes 220 and 240. In this case, the contact electrode may be formed by sequentially depositing chrome/gold (Cr/Au) on each of the first and second electrodes 220 and 240.

Figure 10:
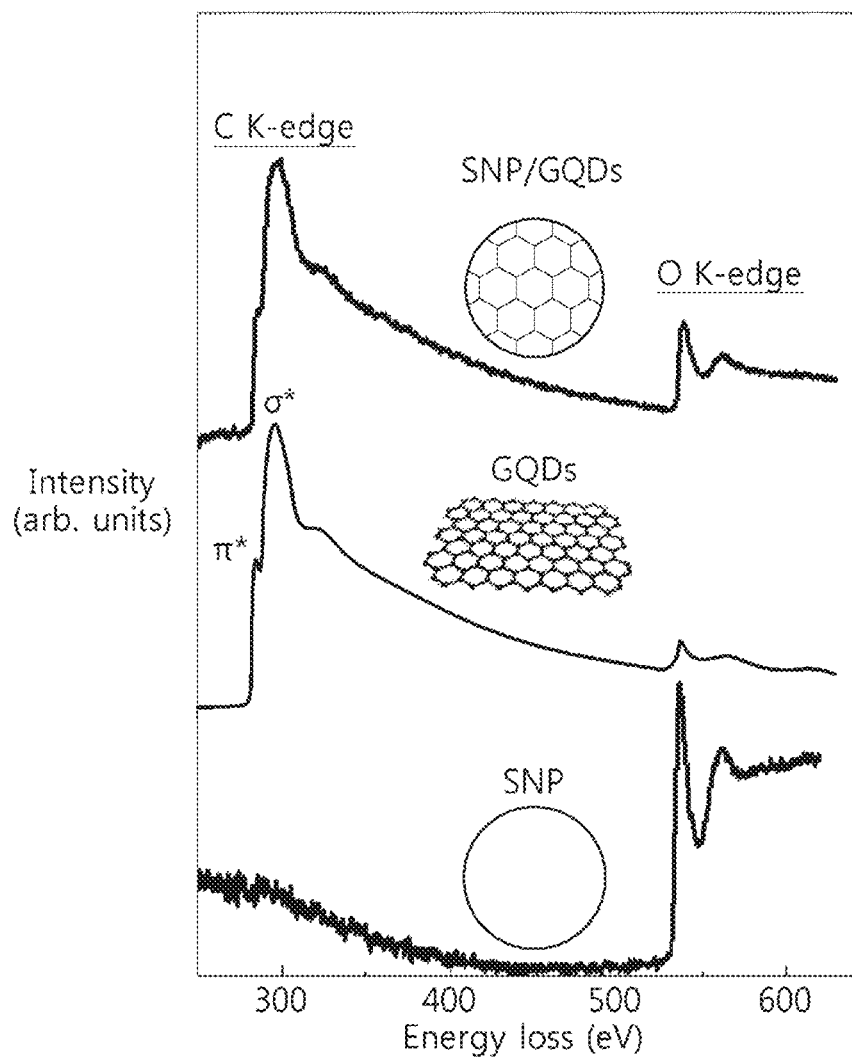
FIG. 10 illustrates electron energy loss spectra of silica nanoparticles (SNPs), graphene quantum dots (GQDs), and a hybrid structure of silica nanoparticles (SNPs)/graphene quantum dots (GQDs) according to an example of the present disclosure.

FIG. 10 illustrates electron energy loss spectra (EELS) of silica nanoparticles (SNPs), graphene quantum dots (GQDs), and a hybrid structure of silica nanoparticles (SNPs)/graphene quantum dots (GQDs) according to an example of the present disclosure.

In the silica nanoparticles (SNPs), only O K-edge signals related to the silica nanoparticles (SNPs) were observed and, in the graphene quantum dots (GQDs), only C K-edge signals related to the graphene quantum dots (GQDs) were observed.

On the other hand, in the hybrid structure according to the example of the present invention, both O K-edge signals related to the silica nanoparticles (SNPs) and the C K-edge signals related to the graphene quantum dots (GQDs) were observed. Due to the O K-edge and C K-edge signals, it can be confirmed that the hybrid structure includes the graphene quantum dots (GQDs) bonded to the silica nanoparticles (SNPs).

FIGS. 11 to 17 illustrate graphs representing electrical/optical characteristics and energy transfer efficiency of a photoelectronic device including the hybrid structure of silica nanoparticles (SNPs)/graphene quantum dots (GQDs) according to the example of the present disclosure and materials or photoelectronic devices according to Comparative Examples 1 and 2, based on experimental data. Here, the structures of the photoelectronic devices according to the example and the comparative examples are as follows.

EXAMPLES

Figure 9:
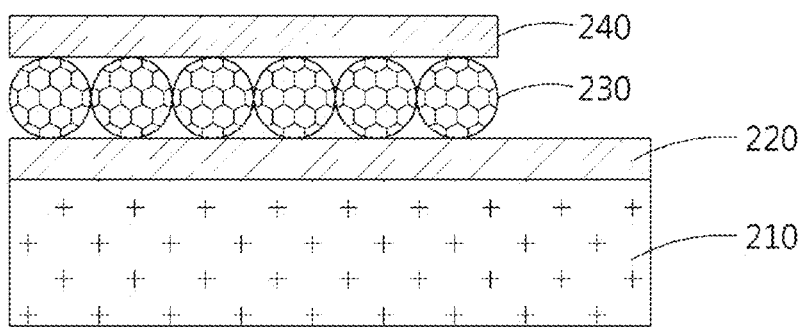

As illustrated in FIG. 1 or 9, a photoelectronic device according to the present disclosure includes an energy conversion layer 130 or 230 having a hybrid structure of silica nanoparticles (SNPs)-graphene quantum dots (GQDs).

Comparative Example 1

The configuration of a photoelectronic device according to Comparative Example 1 is the same as that of the photoelectronic device illustrated in FIG. 1 or 9, except that an energy conversion layer of the photoelectronic device is only composed of silica nanoparticles (indicated as "SNP" or "SNPs" on graphs).

Comparative Example 2

The configuration of a photoelectronic device according to Comparative Example 1 is the same as that of the photoelectronic device illustrated in FIG. 1 or 9, except that an energy conversion layer of the photoelectronic device is only composed of graphene quantum dots (GQDs) (indicated as "GQDs" on graphs).

Figure 11:
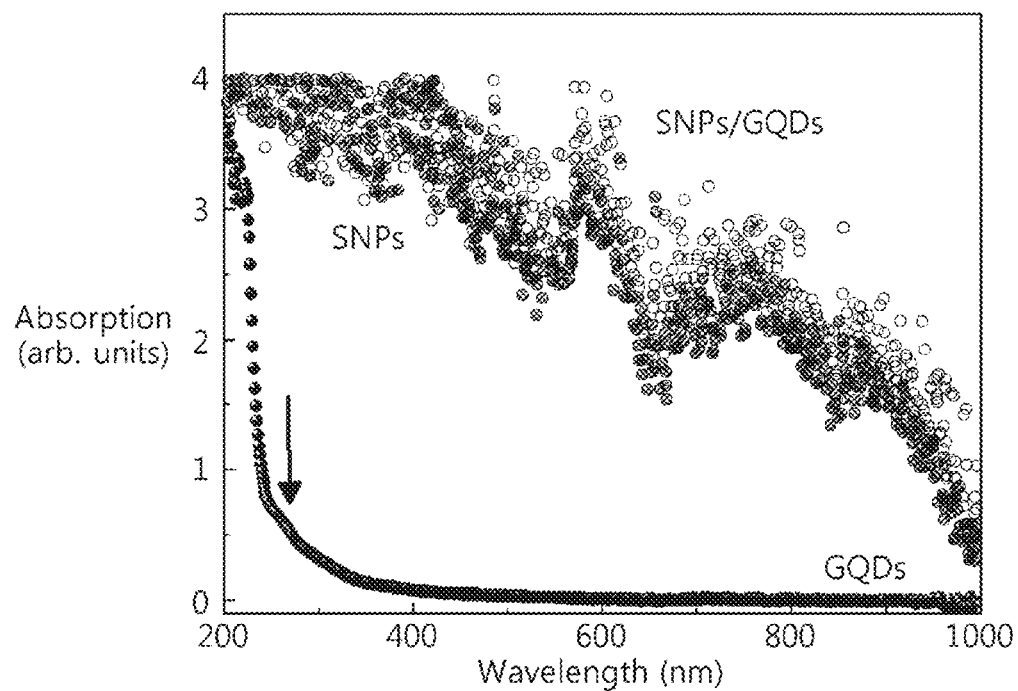
FIG. 11 illustrates optical absorption spectra of photoelectronic devices according to Comparative Examples 1 and 2 and a photoelectronic device including a hybrid structure of silica nanoparticles (SNPs)/graphene quantum dots (GQDs) according to an example of the present disclosure.

FIG. 11 illustrates optical absorption spectra of photoelectronic devices according to Comparative Examples 1 and 2 and a photoelectronic device including a hybrid structure of silica nanoparticles (SNPs)/graphene quantum dots (GQDs) according to an example of the present disclosure.

In the photoelectronic device according to Comparative Example 1, optical absorption occurred in a wavelength range of 200 nm to 1000 nm. In the photoelectronic device according to Comparative Example 2, optical absorption occurred near a wavelength of 250 nm.

In the photoelectronic device according to the example, optical absorption occurred in a wavelength range of 200 nm to 1000 nm, which is similar to the optical absorption spectrum of Comparative Example 1. However, it can be confirmed that an optical absorption degree over the wavelength range of 200 nm to 1000 nm in the photoelectronic device according to the example is high, compared to Comparative Example 1.

This occurs due to mix of optical absorption by the silica nanoparticles (SNPs) and optical absorption by the graphene quantum dots (GQDs). That is, it can be confirmed that an optical absorption ratio increases due to the hybrid structure of the silica nanoparticles (SNPs)-graphene quantum dots (GQDs).

FIGS. 12 and 13 are photoluminescence (PL) and photoluminescence peak shift graphs of photoelectronic devices according to Comparative Examples 1 and 2 and a photoelectronic device including a hybrid structure of silica nanoparticles (SNPs)/graphene quantum dots (GQDs) according to an example of the present disclosure.

Referring to FIG. 12, the photoluminescence (PL) of the photoelectronic device according to Comparative Example 1 occurs in a wavelength range of 350 nm to 700 nm and the peak photoluminescence is observed at 382 nm (3.25 eV).

In addition, the photoluminescence (PL) of the photoelectronic device according to Comparative Example 2 occurs in a wavelength range of 370 nm to 600 nm and the peak of the photoluminescence is observed at 414 nm (2.99 eV).

The photoluminescence (PL) of the photoelectronic device according to the example occurs in a wavelength range of 350 nm to 700 nm and the peak of the photoluminescence is observed at 450 nm.

Meanwhile, the peak of the photoluminescence of the photoelectronic device according to the example is redshifted by about 36 nm, compared to that of the photoelectronic device according to Comparative Example 2. Simultaneously, the photoluminescence of the photoelectronic device according to the example is much higher than that of Comparative Example 2. This can be considered to occur since a minimum energy level (S1) of the silica nanoparticles (SNPs) higher than that of the graphene quantum dots (GQDs) and thus energy transfer (ET) occurs from the silica nanoparticles (SNPs) to the graphene quantum dots (GQDs).

FIG. 13 illustrates excitation light-photoluminescence peaks of the photoelectronic device according to each of Comparative Example 2 and the example.

In the case of the photoelectronic device according to Comparative Example 2, when the wavelength of excitation light increases from 300 nm to 480 nm, the photoluminescence peak is redshifted from 421 nm to 551 nm, which is similar to a general photoluminescence peak shift phenomenon in graphene quantum dots (GQDs).

On the other hand, in the case of the photoelectronic device according to the example, the photoluminescence peak gradually decreases while the wavelength of excitation light increases from 300 nm to 400 nm, and the photoluminescence peak gradually increases while the wavelength of excitation light increases from 400 nm to 480 nm.

Meanwhile, when the wavelength of excitation light is greater than 400 nm, the photoluminescence peaks of the photoelectronic device according to Comparative Example 2 almost correspond with those of the example. This is considered to occur since electron-hole pairs cannot be generated in silica nanoparticles (SNPs) when the wavelength of excitation light is greater than 400 nm and thus energy transfer from the silica nanoparticles (SNPs) to the graphene quantum dots (GQDs) does not occur.

On the other hand, electron-hole pair are generated in the silica nanoparticles (SNPs) when the wavelength of excitation light is less than 400 nm and thus energy transfer to graphene quantum dots (GQDs) occurs. Accordingly, in the photoelectronic device according to the example, PL peaks are exhibited at longer wavelength, compared to Comparative Example 2.

FIGS. 14A and 14B are photoluminescence (PL) lifespan graphs of photoelectronic devices according to Comparative Examples 1 and 2 and a photoelectronic device including a hybrid structure of silica nanoparticles (SNPs)/graphene quantum dots (GQDs) according to an example of the present disclosure.

FIG. 14A illustrates photoluminescence (PL) measured according to irradiation time of excitation light while irradiating the photoelectronic device of each of Comparative Example 1 and the example with excitation light having a wavelength of 305 nm. In particular, a PL decay curve with respect to an energy donor is illustrated in each of the photoelectronic devices.

Referring to FIG. 14A, the PL lifespan of the photoelectronic device according to Comparative Example 1 is 2.3 ns ($\tau_D$) and the PL lifespan of the photoelectronic device according to the example is ~0.5 ns ($\tau_{DA}$). Accordingly, it can be observed that the PL lifespan of the photoelectronic device according to the example is decreased, compared to that of Comparative Example 1. This shows that electron-hole pairs which contributed to recombination in the silica nanoparticles (SNPs) are transferred to other energy levels.

Referring to FIG. 14B, the PL lifespan of the photoelectronic device according to Comparative Example 2 is 1.6 ns ($\tau_A$) and the PL lifespan of the photoelectronic device according to the example is 2.7 ns ($\tau_{AD}$). Accordingly, it can be confirmed that the PL lifespan of the photoelectronic device according to the example further increases, compared to that of Comparative Example 2.

That is, charge carriers in the silica nanoparticles (SNPs) are decreased due to energy transfer and the charge carriers transferred to the graphene quantum dots (GQDs) contribute to radiative recombination of the graphene quantum dots (GQDs), thereby increasing the PL lifespan of the graphene quantum dots (GQDs).

FIG. 15 illustrates voltage-dark current curves of photoelectronic devices according to Comparative Examples 1 and 2 and a photoelectronic device including a hybrid structure of silica nanoparticles (SNPs)/graphene quantum dots (GQDs) according to an example of the present disclosure.

Voltage was applied to two electrodes included in the photoelectronic device of each of Comparative Examples 1 and 2 and the example and dark current was measured.

Referring to FIG. 15, the photoelectronic device according to Comparative Example 1 exhibits maximum current at a voltage of ±9 V. The maximum current is less than $10^{-8}$ A/cm². In addition, the photoelectronic device according to Comparative Example 2 exhibits a current of greater than $10^{-5}$ A/cm² at a voltage of ±9 V and a current higher than that of Comparative Example 1 over the entire voltage in forward and backward directions.

Meanwhile, the photoelectronic device according to the example shows a current higher than those of Comparative Examples 1 and 2 over the entire voltage in forward and backward directions. In particular, when compared to Comparative Example 1, the current in the photoelectronic device according to the example increases up to $10^4$ to $10^5$ folds (~$10^4$ folds at a voltage of less than 0 V and ~$10^5$ folds at a voltage of greater than 0 V).

When the graphene quantum dots (GQDs) are bonded to surfaces of the silica nanoparticles (SNPs), distances between the silica nanoparticles (SNPs) and the graphene quantum dots (GQDs) are greatly decreased. Accordingly, charge carriers generated on the surfaces of the silica nanoparticles (SNPs) can easily migrate to the graphene quantum dots (GQDs) and thus current increases, whereby the measured current in the photoelectronic device according to the example is high. In addition, by adjusting the sizes of the graphene quantum dots (GQDs) or doping the graphene quantum dots (GQDs), the electrical characteristics of the photoelectronic device according to the example can be controlled.

Meanwhile, by increasing current density through voltage application to the photoelectronic device according to the example, the photoelectronic device may be used as a light-emitting device. In this case, the aforementioned hybrid structure (SNPs/GQDs) is formed as a single or multiple layers between the electrodes included in the photoelectronic device, thereby increasing current density. Accordingly, light intensity may be controlled.

In addition, the photoelectronic device according to the example may be used as a photosensor or a solar cell for generating photocurrent by irradiating light to an upper part of the photoelectronic device according to the example.

FIGS. 16A to 16C illustrate voltage-current curves dependent upon incident light of photoelectronic devices according to Comparative Examples 1 and 2 and a photoelectronic device including a hybrid structure of silica nanoparticles (SNPs)/graphene quantum dots (GQDs) according to an example of the present disclosure.

Currents dependent upon voltages were measured while irradiating excitation light with a wavelength of each of 325 nm and 532 nm to an upper part of the photoelectronic device of each of Comparative Examples 1 and 2 and the example.

Referring to FIGS. 16A and 16B, it can be confirmed that, when excitation light having a wavelength of 325 nm or 532 nm is radiated to the photoelectronic device according to each of Comparative Examples 1 and 2, current is generated dependently upon voltage, compared to the cases in which light is not radiated (dark).

In addition, referring to FIG. 16C, it also can be confirmed that, when excitation light having a wavelength of 325 nm or 532 nm is radiated to the photoelectronic device according to the example, current is generated dependently upon voltage, compared to the cases in which light is not radiated (dark).

Further, it can be confirmed that currents dependent upon voltages in the photoelectronic device according to the example are higher than those in the photoelectronic devices according to Comparative Examples 1 and 2, and, when excitation light with a wavelength of 325 nm or 532 nm is radiated, currents in the photoelectronic device according to the example are almost the same as those in Comparative Examples 1 and 2.

When these are considered, it can be confirmed that the photoelectronic device according to each of Comparative Examples 1 and 2 and the example has photoreaction to incident light and thus may be used as a solar cell or a photosensor, but the photoelectronic device according to the example exhibits satisfactory performance when used as a solar cell or a photosensor.

FIGS. 17A and 17B illustrate graphs of light responsivity dependent upon voltage of photoelectronic devices according to Comparative Examples 1 and 2 and a photoelectronic device including a hybrid structure of silica nanoparticles (SNPs)/graphene quantum dots (GQDs) according to an example of the present disclosure.

FIG. 17A illustrates light responsivity measured by irradiating the photoelectronic devices with excitation light having a wavelength of 532 nm. From the drawing, it can be confirmed that the photoelectronic device according to Comparative Example 1 respectively represents $\sim 7 \times 10^{-8}$ and $\sim 8 \times 10^{-7}$ A/W at a voltage of ±5V and, accordingly, has low light responsivity. With regard to this, charge carriers are generated in the silica nanoparticles (SNPs) when light is radiated and the silica nanoparticles (SNPs) cannot smoothly transport the charge carriers, thereby exhibiting low responsivity to light.

On the other hand, the photoelectronic device according to Comparative Example 2 respectively exhibits ~0.31 and ~0.007 A/W at a voltage of ±5V and has high light responsivity, compared to the photoelectronic device according to Comparative Example 1. This occurs because the electron-hole pairs generated in the graphene quantum dots (GQDs) migrate upon irradiation with light, thus contributing to current generation.

Meanwhile, the photoelectronic device according to the example has high light responsivity over the entire voltage in forward and backward directions, compared to the photoelectronic device according to Comparative Example 2. Although not shown in the graphs, the order of light responsivity magnitudes in the photoelectronic devices of Comparative Examples 1 and 2 and the example when excitation light having another wavelength is radiated is as follows: Comparative Example 1<Comparative Example 2<the example.

FIG. 17B illustrates graphs representing the light responsivity ($R_{Hybrid}$) of the photoelectronic device according to the example relative to the light responsivity ($R_{GQD}$) of the photoelectronic device according to Comparative Example 2 ($R_{Hybrid}/R_{GQD}$).

Referring to FIG. 17B, when excitation light having a wavelength of 532 nm is radiated, $R_{hybrid}/R_{GQD}$ is very great, i.e., $10^0$ to $10^1$ and $10^2$ to $10^3$ over the entire voltage in forward and backward directions.

In particular, the photoelectronic device according to the example has a high light responsivity ($R_{Hybrid}$) of 0.93 to 4.14 A/W at a voltage area of −2V to −5V. This light responsivity is higher than the light responsivity (~0.5 A/W) of a commercialized photosensor made of silicon (Si) or the light responsivity (0.9 A/W) of a commercialized photosensor made of indium gallium arsenide.

This occurs because the charge carriers generated on the surfaces of the silica nanoparticles (SNPs) due to optical absorption in the photoelectronic device according to the example are transferred to the graphene quantum dots (GQDs) bonded to the surfaces of the silica nanoparticles (SNPs) and thus energy transfer occurs.

In addition, when excitation light having a wavelength of 325 nm is radiated, $R_{hybrid}/R_{GQD}$ increases about two to three fold with respect to voltage in forward and backward directions, compared to when excitation light having a wavelength of 532 nm is radiated.

This can be considered to occur because the silica nanoparticles (SNPs) have a higher optical absorption degree at a wavelength of 325 nm than at a wavelength of 532 nm and thus more charge carriers are transferred to the graphene quantum dots (GQDs), as in the energy transfer results shown as the optical absorption degree and the photoluminescence.

As described above, the present disclosure provides an energy conversion layer in which graphene quantum dots are bonded to silica nanoparticles, thereby improving energy transfer efficiency between silica nanoparticles and graphene quantum dots.

Although the preferred embodiments of the present invention have been disclosed with reference to limited examples and drawings, those skilled in the art will appreciate that various modifications, additions and substitutions are possible, without departing from the scope and spirit of the invention. For example, although the described technologies can be performed in an order different from the order of the described methods and/or the described systems, structures, apparatuses, circuits, etc. are coupled or combined in forms different from the described methods or substituted with other constituents or equivalents, suitable outcomes can be accomplished.

Therefore, it should be understood that the scope of the appended claims include other embodiments and examples and the equivalents of the claims.

What is claimed is:

1. A photoelectronic device, comprising:
    an energy conversion layer having a hybrid structure that comprises graphene quantum dots (GQDs) bonded to surfaces of silica nanoparticles (SNPs); and
    electrodes formed on upper and lower parts of the energy conversion layer.

2. The photoelectronic device according to claim 1, wherein the silica nanoparticles have spherical shapes, and
    the graphene quantum dots have two-dimensional planar shapes and are bonded to surfaces of the spherical shapes.

3. The photoelectronic device according to claim 1, wherein the silica nanoparticles are surface-treated for bonding with the graphene quantum dots.

4. A method of manufacturing a photoelectronic device substrate, the method comprising:
    forming a first electrode on a substrate;
    forming an energy conversion layer having a hybrid structure of silica nanoparticles (SNPs) and graphene quantum dots (GQDs) bonded to surfaces of silica nanoparticles (SNPs) on the first electrode; and
    forming a second electrode on the energy conversion layer.

5. The method according to claim 4, wherein the forming of the energy conversion layer comprises:
    manufacturing the silica nanoparticles;
    manufacturing the graphene quantum dots;
    surface-treating the silica nanoparticles; and
    binding the graphene quantum dots to the surface-treated silica nanoparticles.

6. The method according to claim 5, wherein the surface treating comprises:

adsorbing NH$_2$ ligands to the silica nanoparticles to positively charge the surfaces of the silica nanoparticles;

mixing the silica nanoparticles, to which the NH$_2$ ligands are adsorbed, with a HCl solution; and drying the silica nanoparticles by filtering the HCl solution.

7. The method according to claim 5, wherein the binding comprises mixing the graphene quantum dots immersed in deionized water and the surface-treated silica nanoparticles and mixing an ammonium solution with the deionized water, followed by binding the graphene quantum dots to the surfaces of the silica nanoparticles by means of an ultrasonicator.

* * * * *